(12) United States Patent
Prabaonnaud et al.

(10) Patent No.: US 6,333,855 B2
(45) Date of Patent: *Dec. 25, 2001

(54) DEVICE FOR THE SPACED MOUNTING OF A PRINTED CIRCUIT BOARD ON AN ELECTRICALLY CONDUCTING CARRIER

(75) Inventors: Jean François Prabaonnaud, Prabonnaud; George Wegmann, Paris; Roger Leroy, Lognes; Jean Louis Vassal, Combs-la-Ville, all of (FR)

(73) Assignee: Alarmcom Elpro SA, Champigny (FR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/317,251

(22) Filed: May 24, 1999

(30) Foreign Application Priority Data

May 25, 1998 (EP) .................................................. 98109433

(51) Int. Cl.⁷ ........................................................ H05K 7/14
(52) U.S. Cl. .......................... 361/758; 361/753; 361/759; 361/804; 174/138 G
(58) Field of Search ..................................... 361/752, 753, 361/758, 759, 799, 801, 804, 807; 174/138 D, 138 G; 403/405.1, 406.1, 407.1, 408.1

(56) References Cited

U.S. PATENT DOCUMENTS

| | | | |
|---|---|---|---|
| 3,812,381 | 5/1974 | Guyton | 317/101 |
| 3,836,704 * | 9/1974 | Coules | 174/138 D |
| 4,760,495 * | 7/1988 | Till | 361/758 |
| 4,889,502 * | 12/1989 | Althouse et al. | 439/607 |
| 4,969,065 * | 11/1990 | Petri | 361/758 |
| 5,018,982 * | 5/1991 | Speraw et al. | 439/74 |
| 5,106,225 * | 4/1992 | Andre et al. | 361/804 |
| 5,281,149 | 1/1994 | Petri | 439/66 |
| 5,380,211 * | 1/1995 | Kawaguchi et al. | 439/74 |
| 5,786,989 * | 7/1998 | Kawabe | 361/759 |
| 6,071,131 * | 6/2000 | Pliml, Jr. | 439/95 |

FOREIGN PATENT DOCUMENTS

| | | |
|---|---|---|
| 07058474 | 3/1995 | (JP) . |
| 07098008 | 11/1995 | (JP) . |

\* cited by examiner

Primary Examiner—J N Gandhi
(74) Attorney, Agent, or Firm—BakerBotts LLP

(57) ABSTRACT

A mounting device for supporting a printed circuit board on a carrier includes a spacing element attached onto the carrier and an electrically conducting mounting element coupled to the spacing element for forming a mechanical and electrically conducting connection between the printed circuit board and the carrier. The spacing element has a sleeve-type spacing section and a mounting section attached to the spacing sections. Preferably, the section is formed by elastic, finger-type or wing-type mounting sections that are provided for engagement in corresponding recesses of the carrier. The mounting element is preferably a screw that is screwed into the carrier when tightened.

10 Claims, 1 Drawing Sheet

DEVICE FOR THE SPACED MOUNTING OF A PRINTED CIRCUIT BOARD ON AN ELECTRICALLY CONDUCTING CARRIER

BACKGROUND OF THE INVENTION

Mounting devices or connectors are often required, for example, for mounting printed circuit boards in a housing, wherein the printed circuit boards are separated from an electrically conducting or metallic carrier. The mounting devices must be easily attached onto the carrier such that the printed circuit boards can be placed in the desired position with minimal effort and cost. In addition, the mounting devices must be designed such that reliable and easily detachable mechanical and electrical connections can be formed between the printed circuit boards and the carrier. The printed circuit boards, which are often mounted in housings offering little access to the boards, should also be installable and removable as conveniently as possible.

In view of the foregoing, a conventional mounting device having of a spacing sleeve, a screw and a nut is often inadequate in that the spacing sleeve cannot be affixed onto the carrier and thus must be held in place by hand during installation. In addition, sufficient space within a housing or enclosure is usually required in order to screw the nut in a controlled manner as required.

Conventional plastic, dowel-like mounting devices having elastic mounting wings inserted into corresponding recesses of the carrier, thereby fixing the mounting element on the carrier, are also inadequate in that electrically conducting connections cannot be made. The additional use of a screw and nut with these mounting devices is ruled out for the reasons described above.

Thus, there is a need for a printing circuit board mounting device that overcomes the above-mentioned shortcomings of the conventional mounting devices.

SUMMARY OF THE INVENTION

The present invention provides a printed circuit board mounting device that can be manipulated easily and reliably, thus rendering possible the convenient mounting of a printed circuit board on a carrier, and also the formation of an electrical connection between the printed circuit board and the carrier. Consequently, the mounting device of the present invention allows swift and easy installation and removal of printed circuit boards within an electronic housing or enclosure.

In accordance with a preferred embodiment of the present invention, the mounting device includes: a spacing element for attaching onto the carrier and for supporting the printed circuit board; and an electrically conducting mounting element coupled to said spacing element for forming a mechanical and electrically conducting connection between the circuit board and the carrier.

In another preferred embodiment of the present invention, the mounting device is characterized in that the spacing element is formed of a plastic or elastic material, and includes a sleeve-type spacing section and a mounting section.

In yet another preferred embodiment of the present invention, the mounting device is characterized in that the mounting section includes a plurality of elastic, finger-type or wing-type mounting members provided for engagement in corresponding recesses of the carrier.

In still another embodiment of the present invention, the mounting device is characterized in that the mounting element includes a screw which, in its tightened position, forms an electrical connection between the printed circuit board and the carrier by means of its head or via a shim at a first end in contact with the printed circuit board and by means of its second, free end in contact with the carrier.

Further in accordance with the present invention, the screw has at its second end a tip which, when tightened, is attached to the carrier or into a bore provided in the carrier.

When the mounting devices according to the invention are used, the carriers are provided with recesses for receiving the mounting members and the printed circuit boards are provided with holes for the screws. Optionally, the carriers are also provided with bores for receiving the tips of the screws, which may, however, be omitted if the carriers are composed of a sufficiently soft material and are formed, for example, by aluminum rails or aluminum profiled sections. In that case, it is possible to screw the tips whose material must of course be harder than aluminum, into the solid material of the carriers.

To mount a printed circuit board, the mounting members are fitted into the recesses. This is easily performed, even in the case of unfavorable installation conditions in a large and unmanageable housing, since the recesses on the carrier can be easily located by touch. The printed circuit board is then placed on the spacing elements, typically four per printed circuit board, and positioned such that the holes in the printed circuit board are aligned with the bores of the spacing element. The screws are then fitted through the holes in the printed circuit board into the bores and tightened.

BRIEF DESCRIPTION OF THE DRAWINGS

For a complete understanding of the present invention and the advantages thereof, reference is now made to the following description taken in conjunction with the accompanying Figures in which like reference numerals indicate like features and wherein.

DETAILED DESCRIPTION OF THE PREFERRED EMBODIMENT(S)

Figure 1:
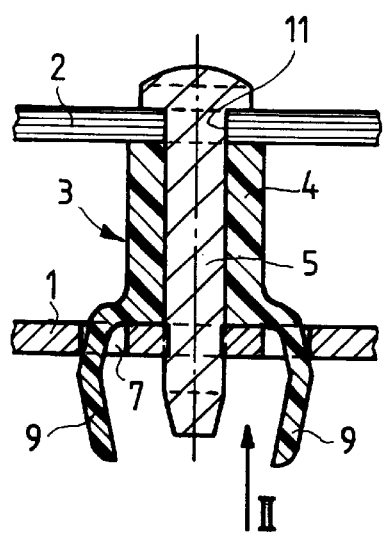
FIG. 1 is a sectional view of a preferred embodiment of a device for mounting a printed circuit board onto a carrier in accordance with the present invention.
Figure 2:
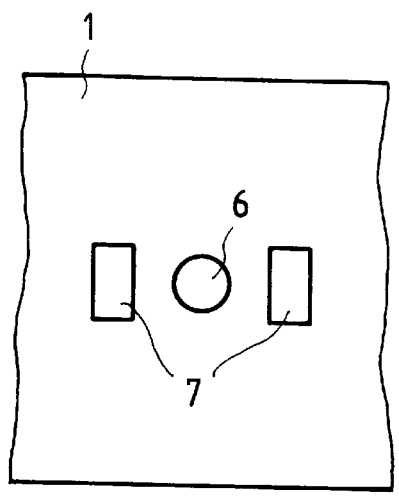
FIG. 2 is a bottom view of a carrier in the direction of the arrow II of FIG. 1.

FIG. 1 shows a sectional view, in accordance with a preferred embodiment of the present invention, of a connection formed between a carrier 1 and a printed circuit board 2 by means of a mounting device 3. The mounting device 3 includes a spacing device 4 and a mounting element or screw 5. As shown in FIG. 2, the carrier 1 is preferably a light-metal rail or plate having at least one bore 6 and on either side thereof two slot-like recesses 7. The diameter of the bore 6 is somewhat smaller than the diameter of the threaded part of the screw 5 such that the bore 6 functions like a nut for the screw 5.

Preferably, the carrier 1 is comprised of a sufficiently soft conducting material, such as aluminum, and is sufficiently thin so as to allow the threading of screw 5. The screw 5 can be a so-called "wood" or sheet-metal screw with a suitable thread and a relatively sharp tip, with the diameter of the screw 5 being larger than the diameter of the bore 6. As such, the screw acts to open up the carrier 1 or the bore 6 appropriately when tightened.

Figure 3:
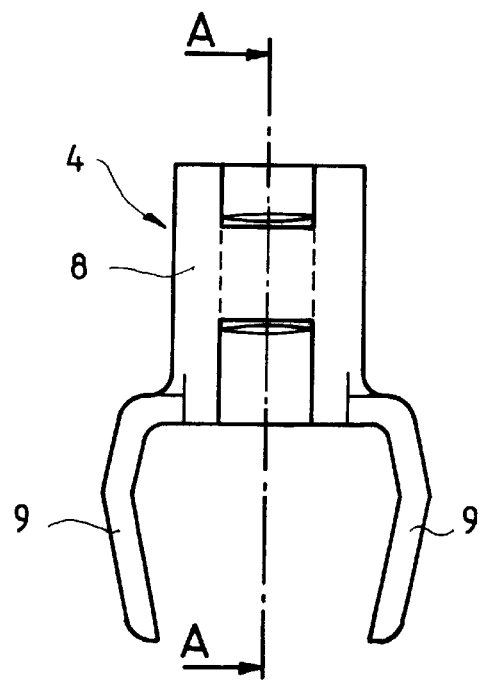
FIG. 3 is a side view of the device of FIG. 1.

The spacing element 4 is constructed of an elastic or plastic material and has, as shown in FIGS. 1 and 3, a sleeve-type spacing section 8 and a plurality of finger-like or wing-like mounting members 9 that are attached to the spacing part and which are provided for engagement in the slot-type recesses 7 of the carrier 1. FIGS. 1 and 3 show, by way of example and not limitation, two mounting members 9. The mounting members 9 preferably have a curved or bent design and are dimensioned such that, when pushed into the recesses 7, the members 9 latch to the carrier 1 under tension. As a result of tensioning, the mounting element 3 is thereby affixed onto the carrier 1.

Figure 4:
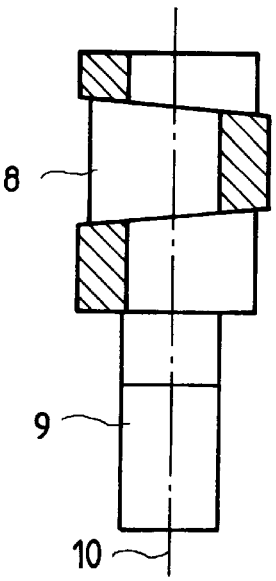
FIG. 4 is a cross-sectional view of the device of FIG. 3 along the line A—A of FIG. 3.

As further shown in FIGS. 3 and 4, the spacing section 8 has the shape of a cylindrical sleeve which is partly perforated at its wall. The wall in the transverse plane A—A, as shown in FIG. 4, includes the mounting members 9, which are composed of a solid material, and alternating regions of solid material and perforations on both sides of the longitudinal axis 10.

The printed circuit board 2 is mounted on the carrier 1 in such a way that the spacing element 4 is first pressed into the recesses 7 by means of its mounting members 9 and latched into the recesses 7. The printed circuit board 2, which has bores 11 for inserting the screws 5 at the mounting points, is then placed on the spacing element 4 such that the bores 11 of the printed circuit board 2 are positioned above the spacing element 4, and the screw 5 is then pushed from the printed circuit board 2 into the spacing means 4 at each mounting point, optionally using a shim (not shown) and finally tightened. Using this process, the screw 5 is screwed into the bore 6 of the carrier 1, and as a result a mechanically stable and electrically conducting connection is made between the carrier 1 and the printed circuit board 2.

Although the present invention has been described in connection with particular embodiments thereof, it is to be understood that various modifications, alterations and adaptions may be made by those skilled in the art without departing from the spirit and scope of the invention. It is intended that the invention be limited only by the appended claims.

What is claimed is:

1. A device for the spaced mounting of a printed circuit board on an electrically conducting carrier having a plurality of recesses formed therein, said device comprising a spacing element attaching onto said carrier and supporting said printed circuit board, and an electrically conducting mounting element coupled to said spacing element forming a mechanical and electrically conducting connection between said printed circuit board and said carrier, said spacing element including a sleeve-type spacing section and a mounting section having a plurality of elastic mounting members for engaging with corresponding ones of said recesses, and wherein said mounting element comprises a screw having a first end in contact with said printed circuit board and a second end in contact with said carrier, wherein said screw forms an electrical connection between said printed circuit board and said carrier.

2. The device according to claim 1, wherein the spacing element is formed of a plastic material.

3. The device according to claim 1, wherein the spacing element is formed of an elastic material.

4. The device according to claim 1, wherein said mounting members are designed such that, when pushed into said recesses of said carrier, said members latch into said recesses under tension.

5. The device according to claim 1, wherein said second end comprises a tip which is screwed into said carrier.

6. The device according to claim 1, wherein said screw is a sheet-metal screw.

7. A device for the spaced mounting of a printed circuit board on an electrically conducting carrier, said device comprising:
a spacing element having a central bore therethrough and mounting members for attaching said device onto the carrier and supporting the printed circuit board, wherein the mounting members include a plurality of finger-like extensions for engagement with corresponding mating recesses in the carrier; and
an electrically conducting mounting element coupled to said spacing element through said central bore for forming a mechanical and electrically conducting connection between the printed circuit board and the carrier.

8. The device according to claim 7, wherein said plurality of finger-like extensions are spaced apart from said central bore.

9. The device according to claim 8, wherein the plurality of finger-like extensions each include a first section extending radially away from said central bore and a second section extending radially towards said central bore such that the finger-like extensions establish a detent fit when engaged in said carrier recesses.

10. A device for the spaced mounting of a printed circuit board on an electrically conducting carrier, said device comprising:
a spacing element having a body with a central bore therethrough and a plurality of elastic mounting members radially displaced from said central bore and axially extending below a lower most portion of said body for attaching said device onto the carrier and supporting the printed circuit board; and
an electrically conducting mounting element coupled to said spacing element through said central bore, forming a mechanical and electrically conducting connection between the printed circuit board and the carrier.

* * * * *